US006939816B2

(12) United States Patent
Rotondaro

(10) Patent No.: US 6,939,816 B2
(45) Date of Patent: Sep. 6, 2005

(54) METHOD TO IMPROVE THE UNIFORMITY AND REDUCE THE SURFACE ROUGHNESS OF THE SILICON DIELECTRIC INTERFACE

(75) Inventor: Antonio L. P. Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 10/001,483

(22) Filed: Nov. 1, 2001

(65) Prior Publication Data

US 2002/0058424 A1 May 16, 2002

Related U.S. Application Data

(60) Provisional application No. 60/247,408, filed on Nov. 10, 2000.

(51) Int. Cl.[7] .................. H01L 21/31; H01L 21/469
(52) U.S. Cl. .................. 438/786; 438/787; 438/791
(58) Field of Search .................. 438/787, 786, 438/791, FOR 388, FOR 494

(56) References Cited

U.S. PATENT DOCUMENTS 6,083,849 A * 7/2000 Ping et al. .................. 134/3
6,240,610 B1 * 6/2001 Ishihara et al. ............. 29/25.01
6,287,988 B1 * 9/2001 Nagamine et al. .......... 438/765
6,297,172 B1 * 10/2001 Kashiwagi .................. 438/773
6,306,774 B1 * 10/2001 Ping et al. ...................... 134/2
6,348,367 B1 * 2/2002 Ohtani et al. ............... 438/151
6,475,815 B1 * 11/2002 Nambu et al. ................. 438/16

FOREIGN PATENT DOCUMENTS

| JP | 06097101 A | * | 4/1994 | ........... H01L/21/20 |
| KR | 2001003691 | * | 1/2001 | ......... H01L/21/334 |

OTHER PUBLICATIONS

Wolf, Stanley et al., "Silicon Procesing for the VLSI Era", vol. 1, 1986 by Lattice Press, pp. 215–216.*

* cited by examiner

*Primary Examiner*—George Fourson
*Assistant Examiner*—Michelle Estrada
(74) *Attorney, Agent, or Firm*—Peter K. McLarty; W. James Brady, III; Frederick J. Telecky Jr.

(57) ABSTRACT

The instant invention is a method for forming a smooth interface between the upper surface of a silicon substrate and a dielectric layer. The invention comprises forming a thin amorphous region (180) on the upper surface (170) of a silicon substrate prior to forming the dielectric layer on the upper silicon surface.

10 Claims, 4 Drawing Sheets

METHOD TO IMPROVE THE UNIFORMITY AND REDUCE THE SURFACE ROUGHNESS OF THE SILICON DIELECTRIC INTERFACE

This application claims priority under 35 USC § 119(e)(1) of provisional application Ser. No. 60/247,408, filed Nov. 10, 2000.

FIELD OF THE INVENTION

The present invention relates to a method to improve the uniformity and reduce the surface roughness of the silicon surface at a silicon and silicon oxide interface.

BACKGROUND OF THE INVENTION

As device dimensions scale, the thickness of the gate oxide has been reduced to less than 2 nm. In this thickness regime, surface roughness and non-uniformity have a significant impact on device performance. Shown in FIG. 1 is a typical MOS transistor. As described above, the thickness of the gate dielectric 20 can be less than 2 nm. For most MOS transistors, the gate dielectric 20 will comprise silicon oxide formed on the silicon substrate. The gate electrode 30, the sidewall structures 40, and the drain region 50 and the source region 60 also comprise the MOS transistor. The MOS transistor shown in FIG. 1 can be formed using standard well known processing techniques. In operation, the proper voltages are applied to the gate 30, drain 50, source 60, and substrate regions 10 to form a depletion region 70 and an inversion region 80. The inversion region 80 is formed at the silicon substrate/gate dielectric interface 90 and comprises free carriers. It is the motion of these free carriers in the inversion region 80 from the source 60 to the drain 50 which results in the drain/source current of the transistor. The amount of transistor current which is produced for given applied voltages depends on the rate at which these free carriers flow through the inversion region 80.

Shown in FIG. 2 is a magnified view of the silicon substrate/gate dielectric region for section 100 illustrate in FIG. 1. Here it is shown that the silicon substrate/gate dielectric interface 90 is not smooth but instead comprises surface roughness shown here in the form of steps. The free carriers in the inversion 110 collide with these steps (or surface roughness) in flowing through the inversion region. These collisions impede the flow of carriers 110 and thus reduce the transistor current. These collisions are enhanced in the case of thin gate dielectrics (i.e. less than 2 nm) due to the high electric fields that exist in the inversion layer 80 which forces the free carriers 110 against the interface 90. In addition the presence of the surface roughness introduces non-uniformities in the thickness of the gate dielectric layer 20. These non-uniformities are becoming increasingly important as the thickness of the gate dielectric layer is reduced.

The realization of atomically flat surfaces on a <100> silicon surface is an extremely difficult task that is becoming even more challenging as wafer diameter increases. A method is therefore need to produce atomically flat silicon substrate/gate dielectric interfaces.

SUMMARY OF INVENTION

The instant invention is a method for forming an atomically smooth interface between a silicon substrate and a dielectric layer. Prior to forming the dielectric layer, a thin amorphous region is formed on the surface of the silicon substrate. The dielectric layer can be formed using known techniques of thermal growth or film deposition. In particular the method comprises: providing a silicon substrate with an upper surface; forming an amorphous region in said upper surface by exposing said upper surface to halogen species; and forming a dielectric layer on said amorphous region.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
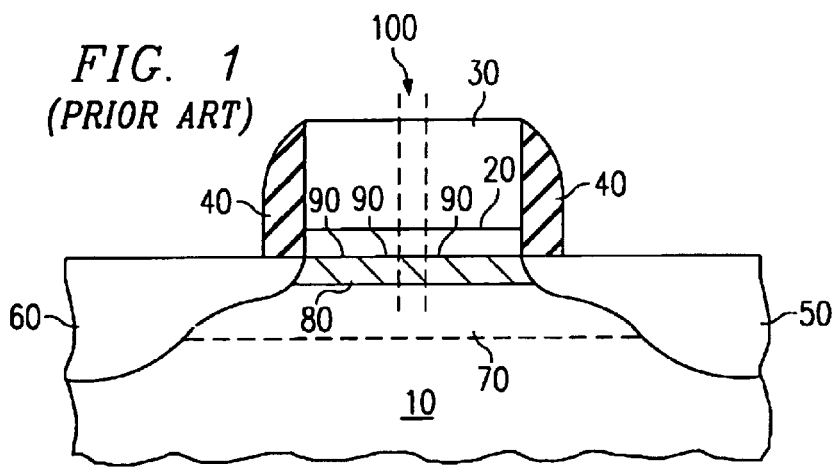
FIG. 1 is a cross-section diagram of a typical MOS transistor.
Figure 2:
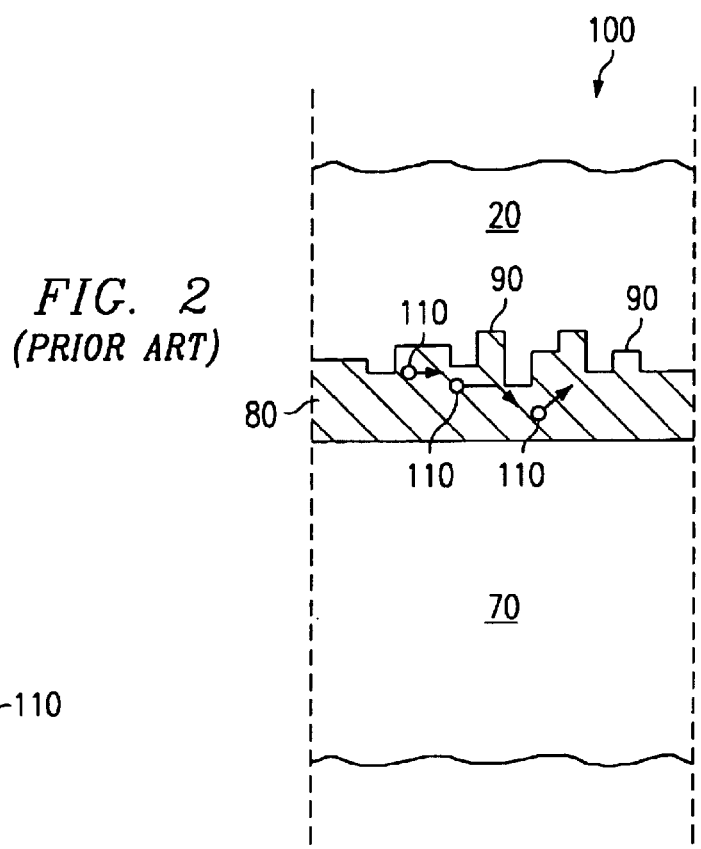
FIG. 2 is a cross-section diagram showing a magnified view of a portion of the silicon substrate/gate dielectric interface of the MOS transistor shown in FIG. 1.

The instant invention comprises forming an amorphous region at the silicon surface before formation of a dielectric layer. The formation of the amorphous region eliminates the surface roughness shown in FIG. 2. The method of amorphous region formation comprises exposing the bare silicon surface to halogen species. The method will be described with reference to a MOS transistor. It should however be noted that the method applies to the formation of a smooth interface between the surface of a silicon substrate and a dielectric layer which can be used in any semiconductor device requiring such an interface.

Figure 3:
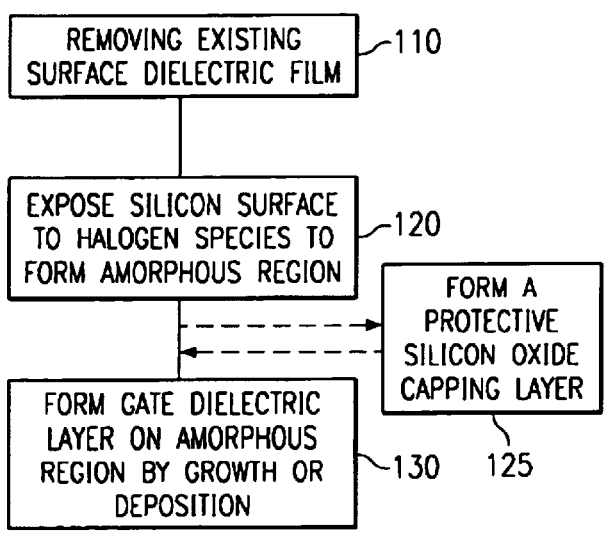
FIG. 3 is a flow diagram illustrating the method of the instant invention.
Figure 4:
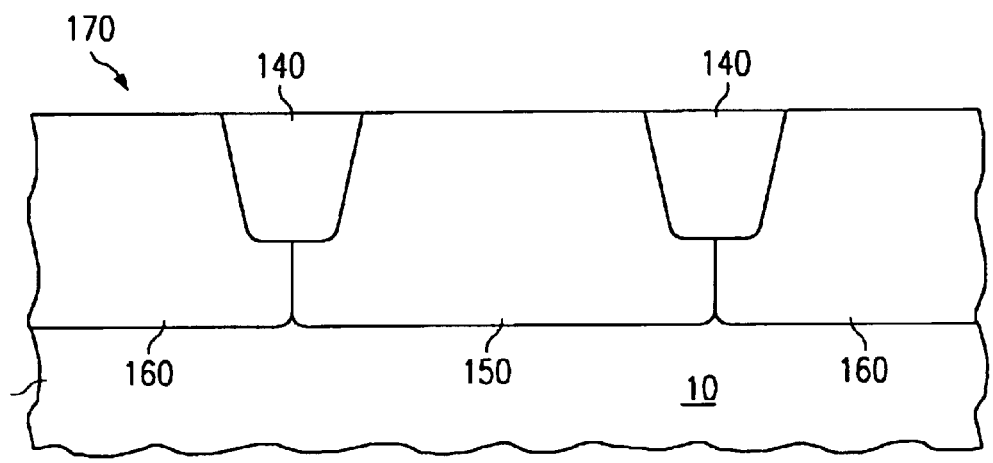
FIG. 4 is a cross-section diagram showing a silicon substrate region prior to the formation of an amorphous region.

Shown in FIG. 3 is a flow diagram outlining the method of the instant invention. In forming an integrated circuit containing MOS transistors, a number of known processing steps are performed before the dielectric layer which will comprise the gate of the MOS transistor is formed. These processing steps include, but are not limited to, isolation formation, n-well formation and p-well formation. Shown in FIG. 4 is a cross-section diagram of a silicon substrate 10 containing dielectric isolation structures 140 and various n-well regions 150 and p-well regions 160 on which the gate dielectric layer will be formed. As illustrated in FIG. 3, the first step in the method of the instant invention is the removal of any thin dielectric layers from the silicon substrate surface 170. In most instances this thin dielectric layer will comprise silicon oxide. In addition to silicon oxide, other dielectric films which might also be present on the surface 170 include silicon nitride and silicon oxynitride. In the case of silicon oxide, the thin dielectric film can be removed using wet or dry methods. In an embodiment of the instant invention, the silicon oxide film can be removed using a dilute HF solution. Such a dilute solution can comprise a 1:100 volume dilution of 49% HF at room temperature for a duration that is adequate to completely remove the silicon oxide layer. In another embodiment of the instant invention, a dry process comprising a mixture of anhydrous HF and isopropyl-alcohol can be used to remove the silicon oxide layer.

Figure 5:
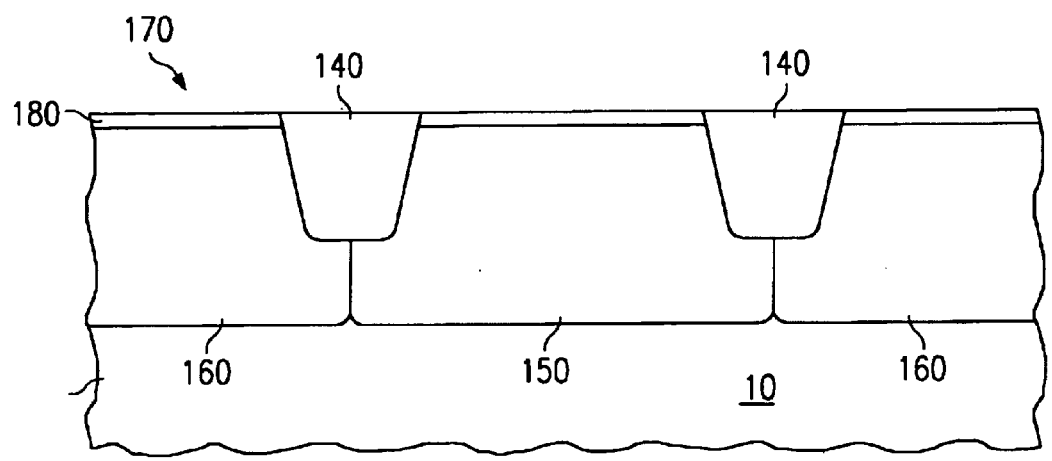
FIG. 5 is a cross-section diagram showing the amorphous region formed on the cross-section of FIG. 4.

Following the removal of any dielectric layers from the surface of the substrate, a thin amorphous region is formed at the surface as outlined in 120 of FIG. 3 and shown in FIG. The thin amorphous region 180 illustrated in FIG. 5 is formed by exposing the silicon substrate surface 170 to halogen species. Preferentially, the halogen atoms or molecules are in an energetic excited state and/or the surface 170 of the silicon substrate is heated. In an embodiment of the instant invention, ultra violet (UV) radiation is used to generate excited chlorine (Cl) species using chlorine containing gases. Excited chlorine species in the instant invention refers to chlorine species where some of the electrons associated with the chlorine species occupy higher energy states after expose to the UV radiation. UV radiation can also be used to heat the surface of the silicon substrate 170 to the temperature range of 50° C. to 250° C. depending on the degree of amorphization desired. The flow of the chlorine containing gas can be varied in the range of 150 sccm to 600 sccm with a typical value of 350 sccm. The pressure in the process chamber can be set between 1 torr and 25 torr with a typical value of 6 torr. The amorphous region 180 created using the above method is self limiting with a typical layer thickness of a few angstroms. Formation of the amorphous layer 180 will eliminate the surface roughness shown in FIG. 2 allowing for improved gate dielectric layer thickness uniformity.

In addition to chlorine species, other halogen species can be used to form the amorphous region. These species include bromine, iodine and fluorine. Although the above method was described using UV excitation, any suitable method of producing excited halogen species can be used. Such methods may include plasma and microwave excitation. The wafer surface can be heated using any number of suitable methods in addition to the UV method described above. Such methods might include contact heating implemented by heating the wafer holder.

In many instances it will be advantageous to perform the method of the instant invention in a multiple chamber cluster tool. In such a process tool, some or all of the process steps: a) thin dielectric layer removal, b)amorphous layer formation, and c) the subsequent oxide and/or dielectric layer formation can be performed in a controlled ambient. This is advantageous because the dielectric layer can be formed without exposing the amorphous region to an oxidizing ambient such as would be the case if the wafer had to be transported from process tool to process tool in the ambient of a silicon fabrication facility.

Following the formation of the amorphous region 180 a optional protective silicon oxide cap can be formed on the amorphous layer 180 using a low temperature self-limiting process. This optional step 125 is illustrated in FIG. 3. In an embodiment of the instant invention, UW radiation can be used in conjunction with an oxygen containing gas mixture to grow about 6A of silicon oxide by a self-limiting process. In an embodiment of the instant invention this comprises oxygen gas. The formation of this protective silicon oxide capping layer is an optional step. Whether or not this protective capping layer is formed will depend on a number of factors including whether a cluster type processing tool is used.

Figure 6:
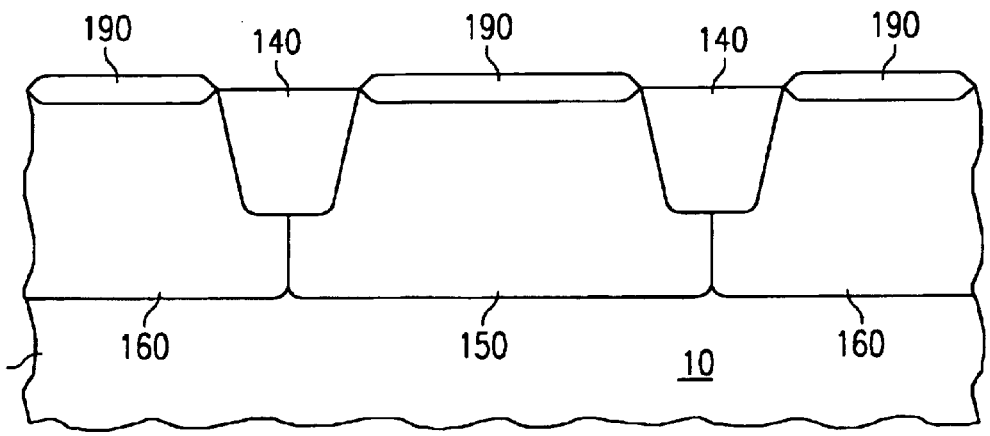
FIG. 6 is a cross-section diagram showing the formation of the gate dielectric layer on the cross-section of FIG. 5.

Following the formation of the amorphous region 180(and the silicon oxide capping layer if formed) the dielectric layer is formed 190 as shown in FIG. 6. This dielectric layer formation step 130 is illustrated in FIG. 3. The dielectric layer 190 can be formed using thermal growth or film deposition methods. In an embodiment of the instant invention where the dielectric layer comprises silicon oxide, the silicon oxide layer can be formed by heating the surface of the silicon substrate containing the amorphous region and exposing the heated surface to an oxidizing ambient containing oxygen species. A number of well known methods for forming silicon oxide dielectric layers using thermal oxidation methods exist in the art. Following the formation of the dielectric layer 190, the MOS transistor (or any other device) can be completed using known processing methods.

Figure 7A:
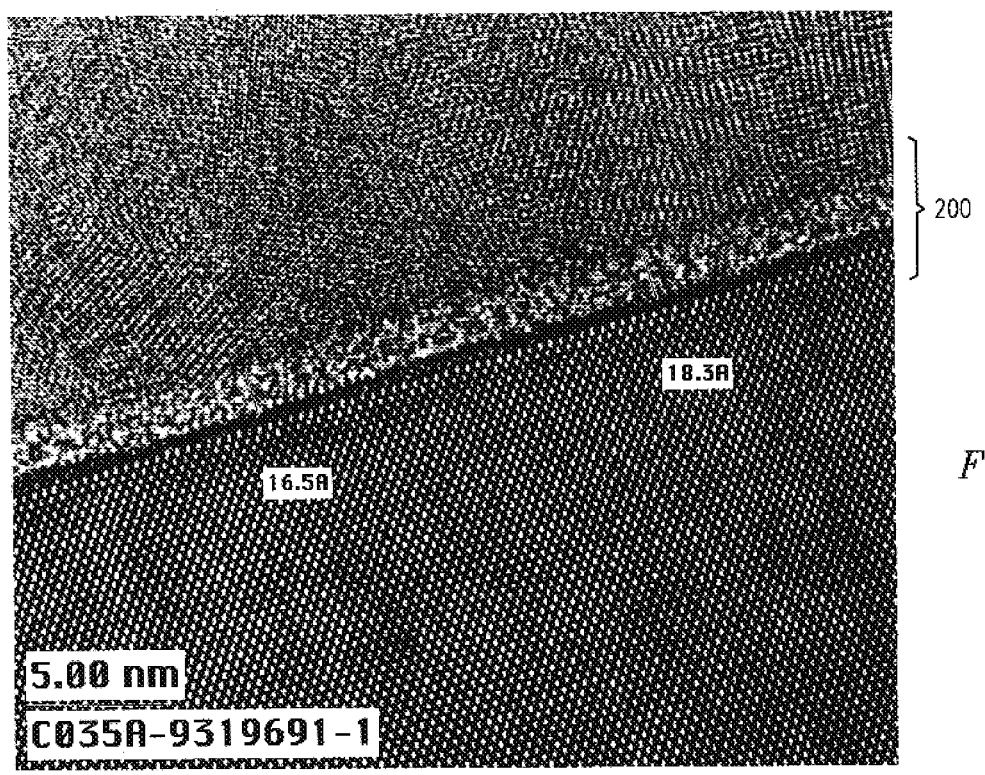
FIGS. 7(a) and 7(b) are TEM micrographs showing silicon/silicon oxide interfaces formed according to known methods and the method of the instant invention.
Figure 7B:
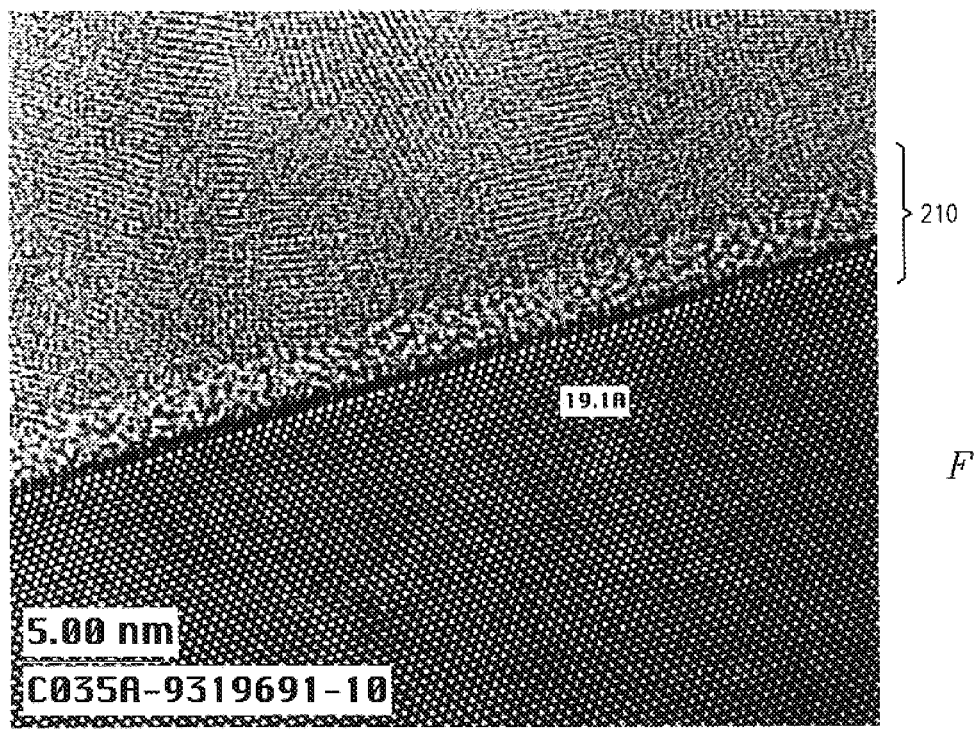

Shown in FIG. 7(a) is a TEM micrographs showing the silicon/silicon oxide interface for a silicon surface that was prepared using existing methods. The interface region 200 shows visible surface roughness. Shown in FIG. 7(b) is a TEM micrographs showing the silicon/silicon oxide interface for a silicon surface that was prepared using the method of the instant invention. In particular, an amorphous region was formed at the surface using UV excited chlorine containing gas before the oxidation process. The interface region 210 shows a sharply defined transition region with no visible signs of surface roughness.

In another embodiment of the instant invention, a gate dielectric layer of silicon oxide can be deposited on the amorphous region using known deposition methods. In addition to silicon oxide, other suitable gate dielectric layers include silicon nitride, silicon oxynitride, and high dielectric constant films like silicates can be used.

The instant invention has been described with reference to a MOS transistor. The method is not however confined to a MOS transistor. The method can be used to form an atomically smooth silicon/dielectric interface in any number of other semiconductor devices including MOS capacitors, memory cells, detectors, charge coupled devices, thin film transistors, etc.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A method for forming a smooth interface between a silicon surface and a dielectric layer comprising:

providing a silicon substrate with an upper surface;

exposing a chlorine containing gas to UV radiation to form excited chlorine species;

heating said upper surface to a temperature between 50° C. and 250° C.;

exposing said heated upper surface to said excited chlorine species to form an amorphous region; and forming a dielectric layer on said amorphous region.

2. The method of claim 1 further comprising removing a dielectric layer from said upper surface prior to forming said amorphous region.

3. The method of claim 1 wherein said dielectric layer is formed using a material selected from the group consisting of silicon oxide, silicon nitride, silicon oxynitride, and a silicate.

4. A method for forming an interface between a silicon surface and a dielectric layer comprising:

providing a silicon substrate with an upper surface;

forming an amorphous region in said upper surface by exposing said upper surface to halogen species;

forming a capping layer on said amorphous region; and forming a dielectric layer on said capping layer.

5. The method of claim 4 further comprising removing a dielectric layer from said upper surface prior to forming said amorphous region.

6. The method of claim 4 wherein said halogen species is selected from the group consisting of chlorine, bromine, iodine and fluorine.

7. The method of claim 4 wherein said forming said amorphous further comprises:

exposing a chlorine containing gas to UV radiation to form excited chlorine species;

heating said upper surface to a temperature between 50° C. and 250° C.; and exposing said heated upper surface to said excited chlorine species.

8. The method of claim 4 wherein said dielectric layer is formed using a material selected from the group consisting of silicon oxide, silicon nitride, silicon oxynitride, and a silicate.

9. A method for forming a smooth interface between a silicon surface and a dielectric layer comprising:

providing a silicon substrate with an upper surface;

exposing a chlorine containing gas to UV radiation to form excited chlorine species;

heating said upper surface to a temperature between 50° C. and 250° C.;

exposing said heated upper surface to said excited chlorine species thereby forming an amorphous region on said upper surface; and forming a dielectric layer on said amorphous region.

10. The method of claim 9 wherein said dielectric layer is formed using a material selected from the group consisting of silicon oxide, silicon nitride, silicon oxynitride, and a silicate.

* * * * *